US008003516B2

(12) United States Patent
Anderson et al.

(10) Patent No.: US 8,003,516 B2
(45) Date of Patent: Aug. 23, 2011

(54) BEOL INTERCONNECT STRUCTURES AND RELATED FABRICATION METHODS

(75) Inventors: Brent A. Anderson, Essex Junction, VT (US); Edward J. Nowak, Essex Junction, VT (US); Jed H. Rankin, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/547,770

(22) Filed: Aug. 26, 2009

(65) Prior Publication Data

US 2011/0049724 A1 Mar. 3, 2011

(51) Int. Cl.
*H01L 21/4763* (2006.01)
(52) U.S. Cl. .... 438/624; 438/633; 438/637; 257/E21.58
(58) Field of Classification Search .................. 438/619, 438/622, 624, 626, 631–634, 637–640, 687; 257/E21.576, E21.58
See application file for complete search history.

(56) References Cited

U.S. PATENT DOCUMENTS

| 6,057,226 | A | 5/2000 | Wong |
| 6,211,056 | B1 | 4/2001 | Begley et al. |
| 6,492,705 | B1 | 12/2002 | Begley et al. |
| 6,797,622 | B2 | 9/2004 | Brask et al. |
| 7,071,532 | B2 | 7/2006 | Geffken et al. |
| 7,078,814 | B2 | 7/2006 | Stamper |
| 2006/0057835 | A1 | 3/2006 | Anderson et al. |
| 2006/0258147 | A1* | 11/2006 | Colburn et al. ............ 438/622 |

* cited by examiner

*Primary Examiner* — Thanhha Pham
(74) *Attorney, Agent, or Firm* — Wood, Herron & Evans, LLP

(57) ABSTRACT

Methods for forming voids in BEOL interconnect structures and BEOL interconnect structures. The methods include forming a temporary feature on a top surface of a first dielectric layer and depositing a second dielectric layer on the top surface of the first dielectric layer. The temporary feature is removed from the second dielectric layer to define a void in the second dielectric layer that is laterally adjacent to a conductive feature in the second dielectric layer. The void operates to reduce the effective dielectric constant of the second dielectric layer, which reduces parasitic capacitance between the conductive feature and other conductors in the BEOL interconnect structure.

17 Claims, 7 Drawing Sheets

US 8,003,516 B2

BEOL INTERCONNECT STRUCTURES AND RELATED FABRICATION METHODS

BACKGROUND

The present invention relates generally to semiconductor device fabrication and, in particular, to methods of fabricating back-end-of-line (BEOL) interconnect structures and BEOL interconnect structures formed by the methods.

In modern electronics, high levels of functionality are achieved on a single chip by integrating large numbers of devices. One process commonly employed in achieving high circuit densities is by using BEOL interconnect structures to link numerous devices, thereby forming a complex integrated circuit. In this way, a wide range of electronic functions, such as central processing units (CPUs), application specific integrated circuits (ASICs), or Radio Frequency Integrated Circuits (RFICs) can be provided on a single chip.

BEOL interconnect structures are routinely fabricated by damascene processes, such as a dual damascene process in which a dielectric layer is deposited, vias and trenches are etched in the dielectric layer, and the vias and trenches are filled with a conductor using a single blanket deposition followed by planarization. This process is replicated to stack different conductive and via levels to create a multi-level, high density framework of conductive interconnections.

As feature sizes shrink with advances in technology node, the dimensions of the interconnect structure spacing and thicknesses of the dielectric layers are correspondingly reduced. Reduced spacing between interconnect structures results in higher levels of capacitive coupling between the structures, which adversely affects circuit performance. For example, higher levels of capacitance between data lines in digital circuitry will introduce cross-talk that lowers the maximum clock speed at which a circuit can operate without introducing bit errors. In another example, parasitic capacitances between BEOL interconnect structures lowers the maximum frequency at which an analog circuit can operate by introducing unwanted phase shifts and attenuation to signals carried by the structures. The problems caused by parasitic capacitance between different metallization levels of BEOL interconnect structures are further exacerbated by higher levels of inductance and resistance that frequently accompany reductions in interconnect structure dimensions.

Improved BEOL interconnect structures and methods for fabricating BEOL interconnect structures are needed that reduce parasitic capacitance between conductors.

BRIEF SUMMARY

In one embodiment, a method is provided for fabricating a back-end-of-line (BEOL) interconnect structure. The method includes forming a temporary feature on a top surface of a first dielectric layer and depositing a second dielectric layer on the top surface of the first dielectric layer. The second dielectric layer and the first temporary feature are planarized such that a layer thickness of the second dielectric layer is approximately equal to a height of the first temporary feature. A conductive feature is formed that extends from a top surface of the second dielectric layer to a conductive element in the first dielectric layer. The conductive feature is located in the second dielectric layer laterally adjacent to the temporary feature. The method further includes removing the temporary feature from the second dielectric layer to define a void in the second dielectric layer laterally adjacent to the conductive feature. The void operates to reduce the effective dielectric constant of the second dielectric layer, which reduces parasitic capacitance between the conductive feature and other conductors in the BEOL interconnect structure.

In another embodiment, a method is provided for fabricating a BEOL interconnect layer. The method includes forming a first dielectric layer, forming a temporary feature on a top surface of the first dielectric layer, and depositing a second dielectric layer on the top surface of the first dielectric layer. The second dielectric layer and the first temporary feature are planarized such that a layer thickness of the second dielectric layer is approximately equal to a height of the first temporary feature. A conductive feature is formed that extends through the first temporary feature from a top surface of the temporary feature to a top surface of the first dielectric layer. The method further includes removing a portion of the temporary feature from the second dielectric layer to define a void in the second dielectric layer laterally adjacent to the conductive feature.

In another embodiment, a BEOL interconnect structure includes a conductive element in a first dielectric layer, a second dielectric layer on a top surface of the first dielectric layer and conductive element, and a conductive feature in the second dielectric layer. The conductive feature extends through the second dielectric layer from a top surface of the second dielectric layer to the conductive element in the first dielectric layer. The BEOL interconnect structure further includes a void in the second dielectric layer. The void is positioned within the second dielectric layer in a laterally adjacent relationship with the conductive feature. The void has a height approximately equal to a thickness of the second dielectric layer.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
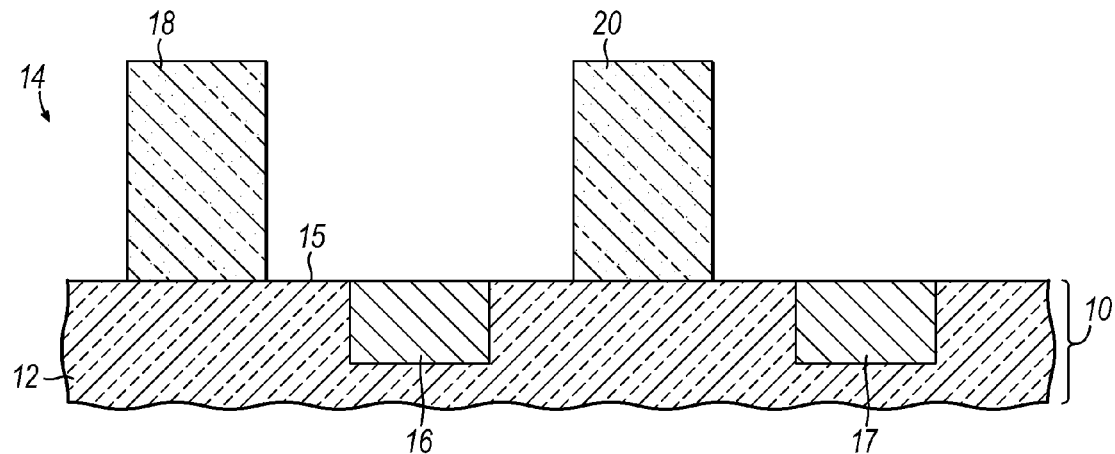
FIG. 1 is a diagrammatic cross-sectional view of a portion of a substrate taken at an initial fabrication stage of a processing method in accordance with an embodiment of the invention.

With reference to FIG. 1 and in accordance with an embodiment of the invention, an interconnect structure, which may be the product of either a front end of line (FEOL) or back end of line (BEOL) process, is generally indicated by reference numeral 14. The interconnect structure 14 comprises a metallization level 10, which may be part of a local or global interconnect level or a contact level. Metallization level 10 as illustrated consists of a dielectric layer 12 composed of an electrically-insulating dielectric material, such as borophosphosilicate glass (BPSG), phosphosilicate glass (PSG), silicon dioxide ($SiO_2$), silicon nitride ($Si_3N_4$), or silicon oxynitride ($SiO_xN_y$) that has been deposited and planarized. Conductive elements, such as representative conductive elements 16, 17, are embedded in dielectric layer 12 forming metalization level 10. Conductive elements 16, 17 may be composed of a conductor such as copper (Cu), aluminum (Al), alloys (e.g., AlCu) of primary metals, and other similar metals.

Dummy features in the representative form of temporary structures 18, 20 are fabricated on top of metallization level 10 using a subtractive etching process involving standard thin film deposition and photolithographic patterning techniques. The temporary structures 18, 20 may be composed of any sacrificial material, such as polycrystalline silicon (poly-Si), suitable for selective etching to the dielectric material in layer 12. Selective etch refers to etching processes in which one material is etched rapidly while another material is etched either very slowly or not etched at all. In one embodiment, the temporary structures 18, 20 may be formed by depositing a blanket layer of poly-Si using conventional Chemical Vapor Deposition (CVD) techniques followed by a resist layer applied and photolithographically patterned in a conventional manner to mask a portion of the poly-Si layer. With the patterned resist layer operating as an etch mask that serves to protect underlying poly-Si at the prospective locations of temporary structures 18, 20, the poly-Si blanket layer may then be etched using Reactive Ion Etching (RIE), or any other suitable dry or wet etching process known to persons with ordinary skill in the art to form temporary structures 18, 20.

Temporary structures 18, 20 operate to displace one or more subsequently deposited dielectric films in areas around and adjacent to the conductive elements 16, 17 that will used to form the interconnect level overlying metallization level 10. Poly-Si is a particularly suitable material to form temporary structures 18, 20 for various different reasons including, but not limited to, its characteristics as a structurally robust material that can be easily removed by selective etching to most commonly used dielectric materials; because Poly-Si can be etched precisely to small dimensions with substantially vertical sidewalls; and because methods of forming poly-Si structures are well known to those having ordinary skill in the art of semiconductor fabrication.

Figure 2:
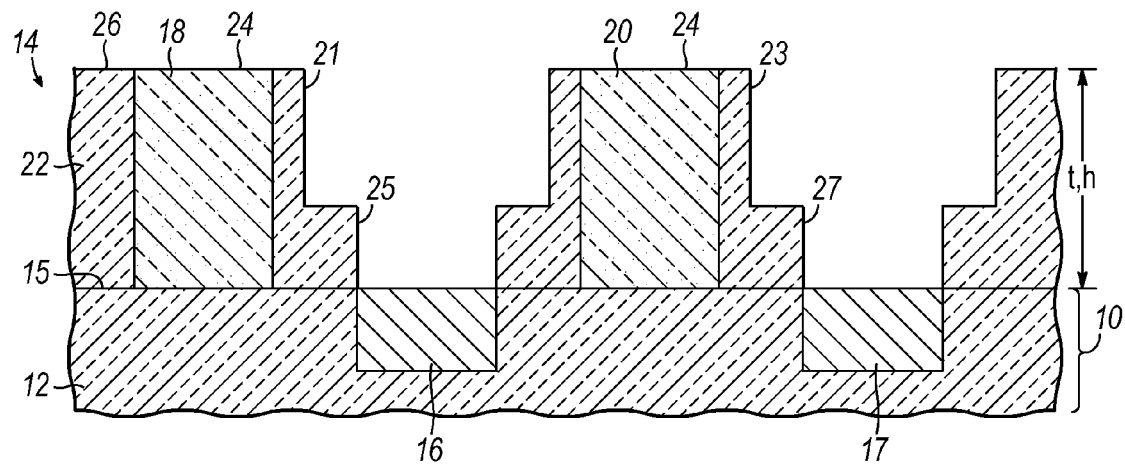
FIGS. 2-5 are diagrammatic cross-sectional views of the portion of the BEOL interconnect structure of FIG. 1 at a series of subsequent fabrication stages.

With reference to FIG. 2 in which like reference numerals refer to like features in FIG. 1 and at a subsequent fabrication stage, a dielectric layer 22 is deposited directly on a top surface 15 of dielectric layer and planarized to form an interlayer dielectric. Dielectric layer 22 may be composed of any suitable electrical insulator, such as $SiO_2$, $Si_3N_4$, $SiO_xN_y$, or fluorine-doped silicon glass (FSG) deposited using traditional CVD methods such as low-pressure-chemical-vapor-deposition (LPCVD), or plasma-enhanced-chemical-vapor-deposition (PECVD). The dielectric layer 22 may be planarized using a conventional process such as Chemical Mechanical Polishing (CMP), so that the top surfaces 24 of the temporary structures 18, 20 are exposed and essentially coplanar with the top surface 26 of dielectric layer 22. Following planarization, a layer thickness, t, of the dielectric layer 22 and a height, h, of the temporary structures 18, 20 are approximately equal.

Via and wiring levels 28, 30 (FIG. 3) are formed using dielectric layer 22 by, for example, a dual damascene process as understood by a person having ordinary skill in the art and collectively constitute a metallization level 29 of the BEOL interconnect structure 14. To that end, wiring trenches 21, 23 and vias 25, 27 of a via level 28 and a wiring level 30 (FIG. 3) are defined in the dielectric layer 22 by a conventional photolithography and etching process. The wiring trenches 21, 23 and vias 25, 27 extend from the top surface 26 of the dielectric layer 22 to the top surface 15 of the dielectric layer 12. The vias 25, 27 are respectively aligned with and communicate with the conductive elements 16, 17 so that the top surface of the conductive elements 16, 17 is revealed.

Figure 3:
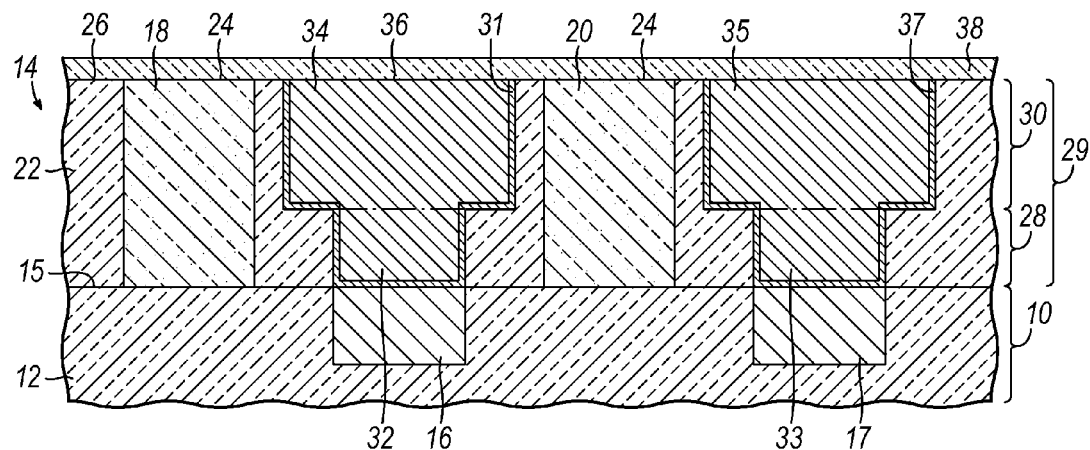

With reference to FIG. 3 in which like reference numerals refer to like features in FIG. 2 and at a subsequent fabrication stage, the wiring trenches 21, 23 and vias 25, 27 (FIG. 2) are filled with respective portions of a conductor using a conventional conductor deposition and planarization process to define conductive studs 32, 33 of via level 28 and conductive wires 34, 35 of wiring level 30. The conductive stud 32 in via level 28 electrically connects conductive element 16 in the metallization level 10 with conductive wire 34 in the wiring level 30 such that a conductive feature is formed. Similarly, the conductive stud 33 in via level 28 electrically connects conductive element 17 in metallization level 10 with conductive wire 35 in the wiring level 30 such that another conductive feature is formed.

Conductive studs 32, 33 and conductive wires 34, 35 may be composed of a conductor such as copper (Cu), aluminum (Al), alloys (e.g., AlCu) and other similar metals, and liner layers 31, 37 may be applied that separate the conductor in the conductive studs 32, 33 and conductive wires 34, 35 from the dielectric layer 22. The liner layers may be composed of a conductor such as tantalum (Ta), tantalum nitride (TaN), titanium (Ti), titanium nitride (TiN), tungsten (W), ruthenium (Ru), iridium (Tr), rhodium (Rh), platinum (Pt), chromium (Cr), niobium (Nb), bilayers of these conductors, or another suitable conductor with material properties appropriate to operate, among other attributes, as a diffusion barrier and an adhesion promoter. These conductors may be deposited and planarized by conventional processes understood by persons having ordinary skill in the art of damascene processes, so that the top surfaces 24 of the temporary structures 18, 20 as well as the top surface 36 of conductive elements 34, 35 are exposed and essentially coplanar with the top surface 26 of dielectric layer 22.

In one embodiment, a hardmask layer 38 may be deposited using conventional techniques known by persons having ordinary skill in the art. The hardmask layer 38 may be composed of any suitable material, such as $SiO_2$, $Si_3N_4$, or $SiO_xN_y$, deposited using a conventional CVD method. Hardmask layer 38 may be utilized to provide a mask layer that is more robust than resist alone when used to remove the temporary structures 18, 20 over dielectric layer 22 by an etching process. Hardmask layer 38 may also be utilized to limit accumulation of subsequently deposited materials in voids left behind after temporary structures 18, 20 have been selectively etched away.

Figure 4:
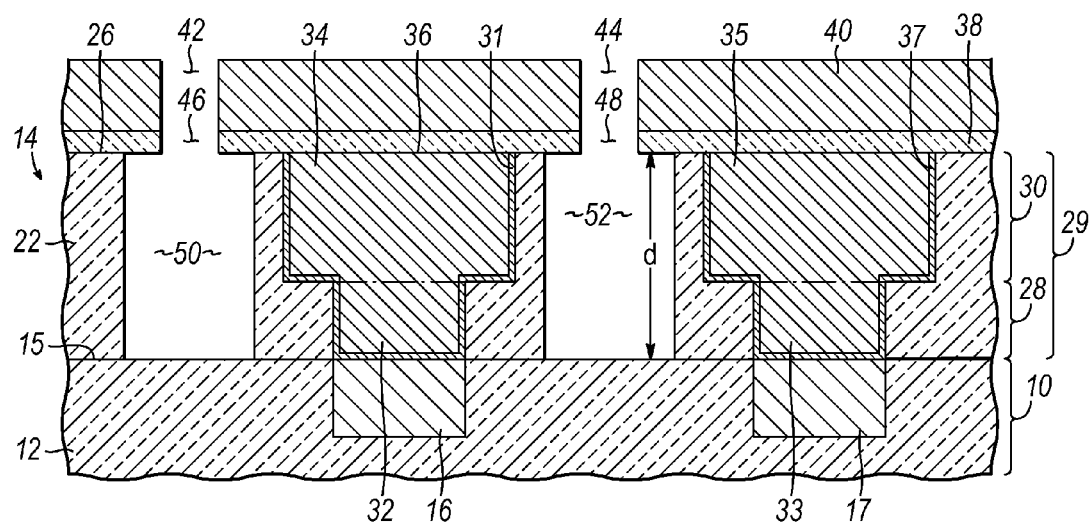

With reference to FIG. 4 in which like reference numerals refer to like features in FIG. 3 and at a subsequent fabrication stage, a resist layer 40 is formed on top of hardmask layer 38 using conventional photolithographic processes known to persons having ordinary skill in the art. For example, resist layer 40 may be formed by dispensing a solution containing resist and a solvent onto hardmask layer 38, spinning the substrate to remove the excess solution, and then heating to drive off the solvent and solidify the residual organic material.

Resist layer 40 may then be selectively exposed to radiation through a patterned mask that is aligned with the substrate 14 or directly written with a beam of radiation. The chemical structure of the material in the resist layer 40 is modified in regions exposed to the radiation. The exposed areas of the resist layer 40 may then be removed using a solvent that removes exposed resist selective to non-exposed resist, forming windows 42, 44 extending through the resist layer 40 and aligned vertically with temporary structures 18, 20. Alternatively, a positive resist may be employed in resist layer 40 to pattern the hardmask layer 38.

Windows 46, 48 are formed in hardmask layer 38 using any suitable wet or dry etching technique, such as RIE, known to those having ordinary skill in the art that removes the hardmask layer 38 selective to the resist layer 40. Resist layer 40 operates as an etch mask and the dimensions of the windows 46, 48 in the hardmask layer 38 are determined by the dimensions of windows 42, 44 in resist layer 40. Each of the windows 46, 48, which penetrate completely through the hardmask layer 38, is registered by vertical alignment with one of the temporary structures 18, 20 so as to expose at least a portion of the top surfaces 24 of temporary structures 18, 20. Windows 46, 48 may be formed with dimensions sufficiently large so as promote the selective etching of temporary structures 18, 20. However, the dimensions of windows 46, 48 are constrained in size so as to not be so large that a subsequently deposited dielectric layer will completely fill the voids 50, 52 created by selectively etching temporary structures 18, 20.

The temporary structures 18, 20 are subsequently removed by an etching process that selectively removes the material constituting the temporary structures 18, 20 at a higher etching rate than the material of hardmask layer 38. Voids 50, 52 are created in the space formerly occupied by the temporary structures 18, 20. The voids 50, 52 represent empty spaces that contain no solid matter. The voids 50, 52 may have an effective dielectric constant of approximately unity (about 1.0) and may be filled by air at or near atmospheric pressure, filled by another gas at or near atmospheric pressure, or contain air or gas below atmospheric pressure (e.g., a partial vacuum) in the completed microelectronic structure. The capacitance between the conductive feature defined by conductive stud 32 and conductive wire 34 and the conductive feature defined by the conductive stud 33 and conductive wire 35 is proportional to the composite dielectric constant of the materials separating the conductive elements. In this instance, the reduced dielectric constant of the voids 50, 52 in comparison with the dielectric material of dielectric layer 22 reduces the average permittivity to significantly decrease parasitic capacitance between the laterally-adjacent conductive features.

The etching process may consist of either a wet chemical etch process or a dry etch process that removes the temporary structures 18, 20. In one embodiment, temporary structures 18, 20 composed of poly-Si may be removed using any suitable polysilicon etchant, such as a solution of potassium hydroxide (KOH) as a selective wet etchant that selectively removes poly-Si relative to $Si_3N_4$ in the hardmask layer 38. Resist layer 40 may be left in place during the selective etch stage or, alternatively, the resist layer 40 may be removed before selectively etching the temporary structures 18, 20. After the temporary structures 18, 20 are removed, any residual material from the resist layer 40 is removed by a conventional process known to a person having ordinary skill in the art. For example, the residual resist layer 40 may be removed by using $O_2$-plasma ashing.

The height, d, of the voids 50, 52 is determined by the layer thickness, t, of the dielectric layer 22 and the height, h, of the temporary structures 18, 20, which are approximately equal. These dimensions are determined primarily by the layer thickness of the layer of material subtractively etched to form temporary structures 18, 20 and by the extent of the material removal by the planarization process that makes the top surface 24 of the temporary features 18, 20 co-planar with the top surface 26 of the dielectric layer 22. The voids 50, 52 extend from the top surface 26 of dielectric layer 22 to the top surface 15 of dielectric layer 12.

A portion of the dielectric layer 22 is disposed between void 50 and the conductive feature defined by conductive stud 32 of via level 28 and conductive wire 34 of wiring level 30. Another portion of the dielectric layer 22 is disposed between void 52 and the conductive feature defined by conductive stud 33 of via level 28 and conductive wire 35 of wiring level 30. The etching process forming voids 50, 52 is non-directional or isotropic, and relies on the etch selectivity differentiating between the material composing the temporary structures 18, 20 and the material of the dielectric layers 12, 22. Removal of the temporary structures 18, 20 results in regions of the hardmask 38 being undercut because the windows 46, 48 are smaller in area than the surface area of the top surface 24 of the temporary features 18, 20. The etching process forming voids 50, 52 does not rely on an etch stop layer, which is absent from the construction.

Figure 5:
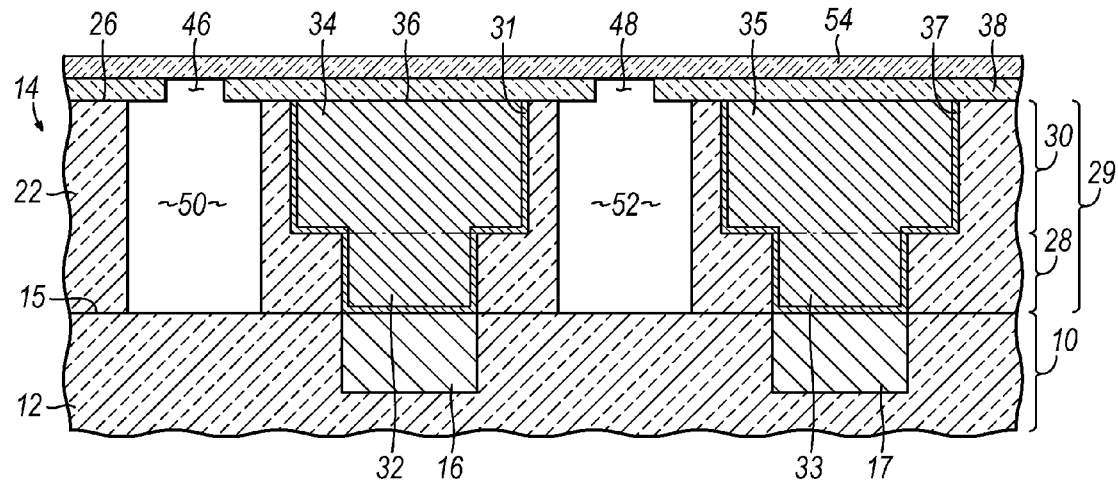

With reference to FIG. 5 in which like reference numerals refer to like features in FIG. 4 and at a subsequent fabrication stage, a dielectric layer 54 is formed using conventional deposition and planarization techniques understood by a person having ordinary skill in the art. Dielectric layer 54 may be composed of the same material as dielectric layer 22, or any other suitable dielectric material such as $SiO_2$, $Si_3N_4$, $SiO_xN_y$, FSG, PSG, or BPSG. In one embodiment, the dielectric layer 54 may be composed of $SiO_2$ deposited using PECVD and planarized using a CMP process. Dielectric layer 54 isolates voids 50, 52 from external elements or subsequent process steps by covering the windows 46, 48 extending through the hardmask layer 38.

Limiting the dimensions of windows 46, 48 to the minimum required for effective etching of temporary structures 18, 20 will result in rapid pinch off occurring during deposition of layer 54 as the windows 46, 48 are bridged, thus limiting infiltration of the dielectric material from dielectric layer 54 into voids 50, 52. Increasing the size of windows 46, 48 may increase the ingress of dielectric material from dielectric layer 54 into the voids 50, 52 before pinch off occurs, but may also allow for faster etching to more rapidly remove the temporary structures 18, 20. A person having ordinary skill in the art will appreciate that some dielectric material from dielectric layer 54 may infiltrate into the voids 50, 52, but that the majority of each void 50, 52 will remain unfilled after the dielectric layer 54 is deposited.

In addition to isolating voids 50, 52, the dielectric layer 54 provides a planar foundation on which to fabricate subsequent interconnect levels. In this way, additional metallization levels and via levels (not shown) may be stacked above the wiring level 30 and may be fabricated by processes similar to those described in FIGS. 1 though 5, or by other conventional BEOL processes known to persons having ordinary skill in the art.

Figure 5A:
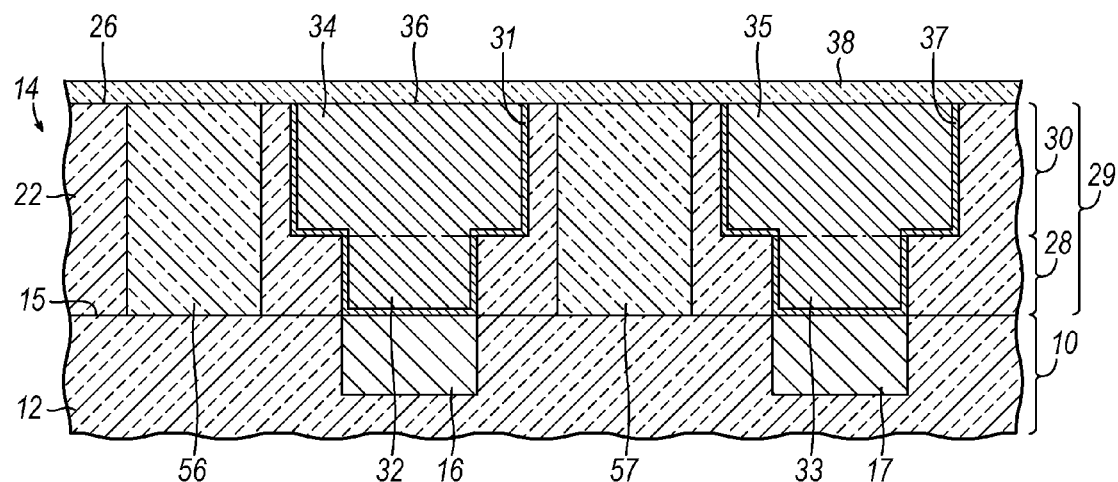
FIG. 5A is a diagrammatic cross-sectional view similar to FIG. 5 in accordance with an alternative embodiment of the invention.

With reference to FIG. 5A in which like reference numerals refer to like features in FIG. 4 and at a subsequent fabrication stage to FIG. 4 in accordance with an alternative embodiment of the invention, the voids 50, 52 may be filled with respective plugs 56, 57 of a material having a lower dielectric constant than the dielectric material constituting the dielectric layer 12 and the dielectric material forming the hardmask 38. In one embodiment, the material in plugs 56, 57 may be an Ultra Low-K dielectric constant (ULK) material, such as a porous oxide, organic polymer, non-porous hydrogen-enriched silicon oxycarbide (SiCOH), also known as organosilicate glass (OSG), or carbon doped oxide (CDO). In one specific embodiment, voids 50, 52 may be filled by depositing a layer of porous $SiO_2$ on hardmask 38 formed by a reaction between tetraethyl orthosilicate (TEOS) and $H_2O$ in a sol-gel process, then heating to drive off excess $H_2O$ and volatile reaction byproducts, followed by CMP. In another specific embodiment, the plugs 56, 57 may be filled by material from a spin-on process. The dielectric layer 54 may then be formed on top of the voids 50, 52 filled with plugs 56, 57 and hardmask layer 38 using the same deposition and planarization techniques described in connection with FIG. 5. The plugs 56, 57 may improve the structural integrity of dielectric layer 22 and/or prevent the dielectric material of higher dielectric constant forming dielectric layer 54 from infiltrating into the voids 50, 52.

In one embodiment of the invention, the windows 46, 48 in hardmask 38 may have different dimensions such that some of the voids 50, 52 to be filled with the plugs 56, 57 while limiting the infiltration of the material of lower dielectric constant into other voids 50, 52 so that those voids remain primarily unfilled. This is accomplished by individually adjusting the dimensions of windows 42, 44 during the photolithographic processes associated with FIG. 4. As apparent, controlling the dimensions of windows 42, 44 in the resist layer 40 regulates the corresponding dimensions of the windows 46, 48 in the hardmask layer 38.

The capacitance between the conductive feature defined by conductive stud 32 and conductive wire 34 and the conductive feature defined by the conductive stud 33 and conductive wire 35 is proportional to the composite dielectric constant of the materials separating the conductive elements. In this instance, the reduced dielectric constant of the plugs 56, 57 in comparison with the dielectric material of dielectric layer 22 reduces the average permittivity to significantly decrease parasitic capacitance between the laterally-adjacent conductive features.

Figure 5B:
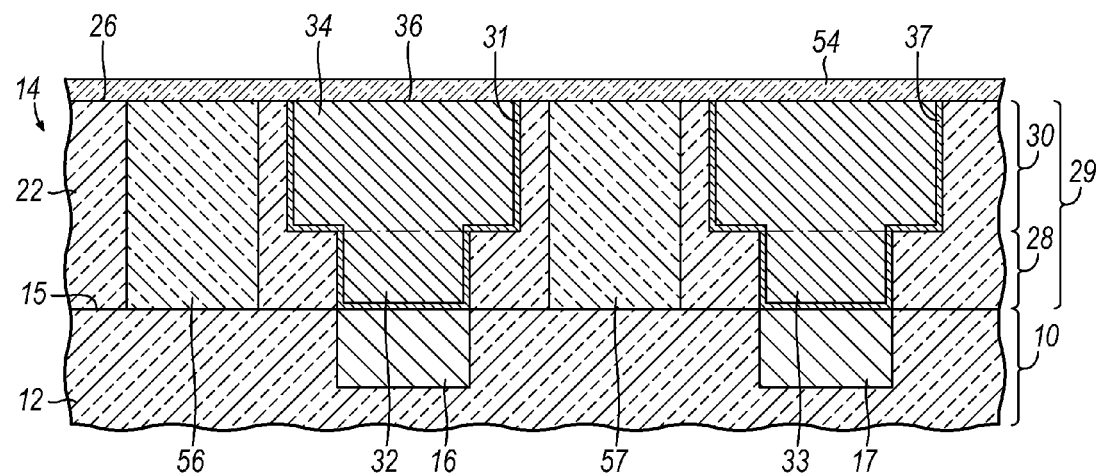
FIG. 5B is a diagrammatic cross-sectional view similar to FIGS. 5 and 5A in accordance with an alternative embodiment of the invention.

With reference to FIG. 5B in which like reference numerals refer to like features in FIG. 4 and at a subsequent fabrication stage to FIG. 4 in accordance with an alternative embodiment of the invention, the hardmask layer 38 may be omitted from the intermediate construction. Instead, the resist layer 40 (FIG. 4) may be formed directly on top of dielectric layer 22. Windows 42, 44 are defined in resist layer 40 such that the windows 42, 44 are aligned directly above and registered with the respective one of the underlying temporary structures 18, 20. The dimensions of the windows 42, 44 determine the corresponding unmasked surface areas of the top surface 24 of the temporary structures 18, 20. The windows 42, 44 expose at least a portion of the top surface 24 of each of the temporary structures 18, 20. In one specific embodiment, the surface area of each of the windows 46, 48 is smaller than the surface area of the top surface 24 of each of the temporary features 18, 20. In another specific embodiment, the dimensions of the windows 42, 44 may be approximately equal to the surface area of the top surface 24 of each of the respective temporary structures 18, 20.

The temporary structures 18, 20 are removed by a suitable wet chemical or dry etching process directed through the windows 42, 44. The characteristics of the etching process are configured to remove the material constituting the temporary structures 18, 20 selective to the materials of resist layer 40 and dielectric layer 22. For example, the temporary structures 18, 20 may be selectively etched relative to the resist layer 40 using a $C_2ClF/SF_6$ fluorine based plasma etching process.

The plugs 56, 57 may be deposited and planarized in the same manner as described above and employed as the primary mechanism to prevent infiltration of dielectric material from layer 54 into voids 50, 52.

Figure 6:
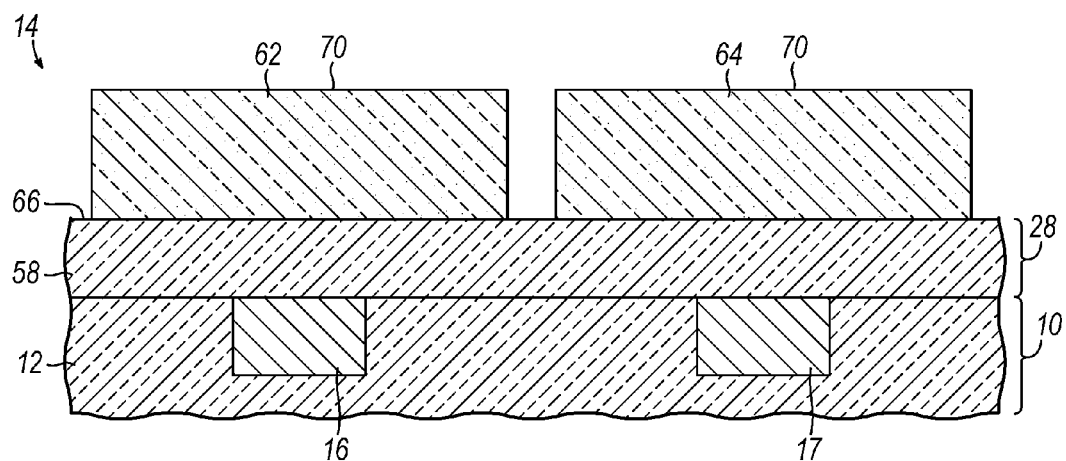
FIG. 6 is a diagrammatic cross-sectional view of a portion of a substrate taken at an initial fabrication stage of a processing method in accordance with an embodiment of the invention.

With reference to FIG. 6 and in which like reference numerals refer to like features in FIGS. 1-5 and in accordance with an alternative embodiment of the invention, a dielectric layer 58 is directly deposited on the top surface 15 of metallization level 10 and is subsequently used to form via level 28. Dielectric layer 58 may be composed of the same material as dielectric layer 12, or any other suitable dielectric material such as $SiO_2$, $Si_3N_4$, $SiO_xN_y$, FSG, PSG or BPSG using the same deposition and planarization techniques as described in connection with FIG. 2.

Temporary structures 62, 64 similar to temporary structures 18, 20 (FIG. 1) are formed on a top surface 66 of the dielectric layer 58. The temporary structures 62, 64 are similar in construction and function to temporary structures 18, 20 (FIG. 1). The temporary structures 62, 64 may be composed of any material, such as poly-Si, suitable for selective etching to dielectric and conductive materials used to form wiring level 30 and via level 28. In one embodiment, the temporary structures 62, 64 may be formed by depositing a layer of poly-Si and patterning the poly-Si layer with a subtractive etching process.

Figure 7:
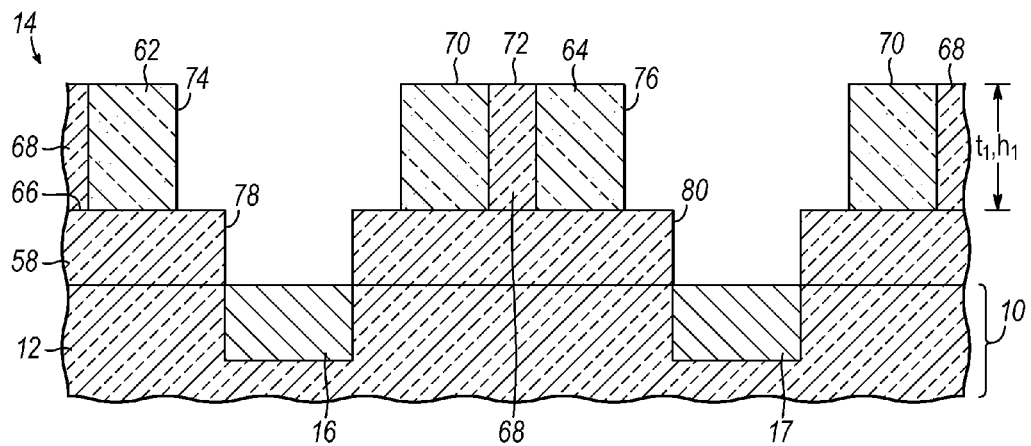
FIGS. 7-10 are diagrammatic cross-sectional views of the portion of the BEOL interconnect structure of FIG. 6 at a series of subsequent fabrication stages.

With reference to FIG. 7 in which like reference numerals refer to like features in FIG. 6 and at a subsequent fabrication stage, the metallization level 29, as illustrated at this stage of fabrication, further includes a dielectric layer 68 deposited directly on the top surface 66 of dielectric layer 58 and laterally about the temporary structures 62, 64. Temporary structures 62, 64 displace a portion of the dielectric layer 68. Dielectric layer 68 may then be formed using the same deposition and planarization techniques as described in FIG. 2, so that a top surface 70 of each of the temporary structures 62, 64 is exposed and substantially coplanar with a top surface 72 of dielectric layer 68. Dielectric layer 68 may be composed of the same material as dielectric layer 58 or any other suitable dielectric material such as $SiO_2$, $Si_3N_4$, $SiO_xN_y$, FSG, PSG or BPSG.

Via and wiring levels 28, 30 (FIG. 3) are formed by, for example, a dual damascene process as understood by a person having ordinary skill in the art and collectively constitute a metallization level 29 of the BEOL interconnect structure 14. To that end, a wiring trench 74 is defined within temporary structure 62 and extends from the top surface 70 of the temporary structure 62 to the top surface 72 of the dielectric layer 58. Similarly, a wiring trench 76 is defined within temporary structure 64 and extends from the top surface 70 of the temporary structure 64 to the top surface 66 of the dielectric layer 58. A via 78 is defined within dielectric layer 58 that extends from the top surface 66 of the dielectric layer 58 to the top surface 15 of the dielectric layer 12. A via 80 is defined within dielectric layer 58 that extends from the top surface 66 of the dielectric layer 58 to the top surface 15 of the dielectric layer 12. The vias 78, 80 are respectively aligned with and communicate with the conductive elements 16, 17.

Figure 8:
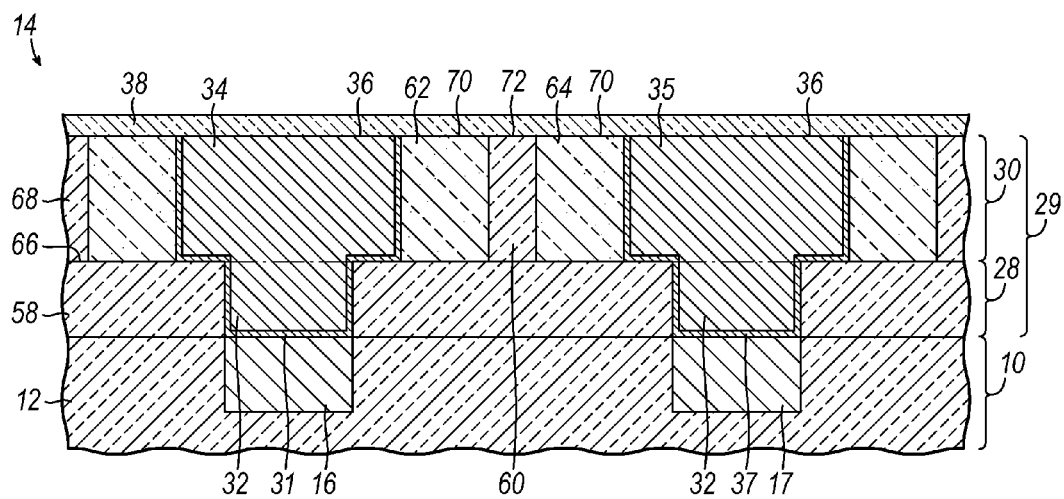

With reference to FIG. 8 in which like reference numerals refer to like features in FIG. 7 and at a subsequent fabrication stage, the conductive stud 32 and wire 34 are respectively formed in the dielectric layer 58 of via level 28 and the temporary structure 62 in wiring level 30. Conductive stud 33 and wire 35 are respectively formed in the dielectric layer 58 of via level 28 and the temporary structure 64 in wiring level 30. Conductive studs 32, 33 and wire 34, 35 may be formed by a dual damascene process similar to that described in connection with FIG. 3. The conductive stud 32 in via level 28 electrically connects conductive element 16 in the metallization level 10 with conductive wire 34 in the wiring level 30 such that a conductive feature is formed. Similarly, the conductive stud 33 in via level 28 electrically connects conductive element 17 in metallization level 10 with conductive wire 35 in the wiring level 30 such that another conductive feature is formed.

Figure 9:
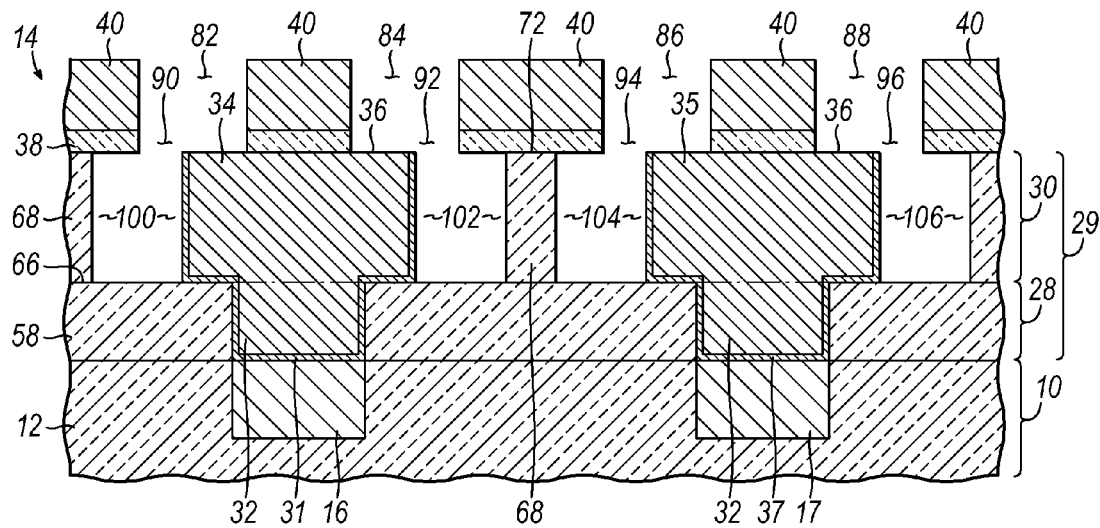

With reference to FIG. 9 in which like reference numerals refer to like features in FIG. 8 and at a subsequent fabrication stage, the hardmask layer 38 is deposited directly on the top surface 72 of dielectric layer 60, the top surface 70 of the temporary features 62, 64, and the top surface 36 of the conductive wires 34, 35 using conventional techniques in the same manner as described in connection with FIG. 3. The resist layer 40 is formed directly on the top surface of the hardmask layer 38 using the same conventional photolithographic techniques as described in FIG. 4. Windows 82, 84 in the patterned resist layer are aligned or registered with different portions of the temporary structure 62 and windows 86, 88 in the patterned resist layer are aligned or registered with different portions of the temporary structure 64. Windows 90, 92, 94, 96 are then formed in hardmask layer 38 using resist layer 40 as a patterned mask permit etching of unmasked regions of hardmask layer 38 as described in FIG. 4. Temporary structures 62, 64 are then removed, leaving voids 100, 102, 104, 106, by an etching process that selectively removes the material used to form temporary structures 62, 64 over the materials used to form hardmask layer 38, dielectric layers 60, 58, and conductive wires 34, 35. The removal process is identical to the removal process described with regard to the removal of temporary features 18, 20 (FIG. 4).

The voids 100, 102, 104, 106 extend from the top surface 70 of dielectric layer 68 to the top surface 66 of dielectric layer 58. The conductor of the wire 34 in wiring level 30 is disposed between void 100 and void 102 without any intervening dielectric material from dielectric layer 68. The conductor of the wire 35 in wiring level 30 is disposed between void 104 and void 106 without any intervening dielectric material from dielectric layer 68. The etching process forming voids 100, 102, 104, 106 is non-directional or isotropic, and relies on the etch selectivity differentiating between the material composing the temporary structures 62, 64 and the material of the dielectric layers 58, 68. Removal of the temporary structures 62, 64 results in regions of the hardmask 38 being undercut because the windows 90, 92, 94, 96 are smaller in area than the surface area of the top surface 70 of the temporary features 62, 64. The etching process forming voids 100, 102, 104, 106 does not rely on an etch stop layer, which is absent from the construction.

Figure 10:
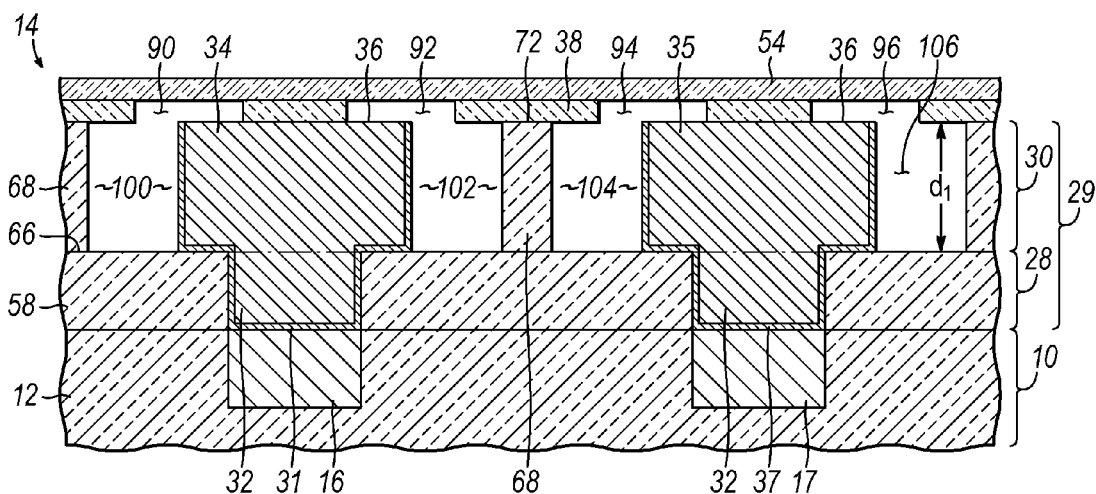

With reference to FIG. 10 in which like reference numerals refer to like features in FIG. 9 and at a subsequent fabrication stage, any remaining resist layer 40 is removed after selectively etching temporary structure 62 using conventional processes in the same manner as described in FIG. 4. For example, resist layer 40 may be removed by using $O_2$-plasma ashing. Dielectric layer 54 is deposited in the same manner as described in FIG. 5. As described above with regard to FIG. 5, dielectric layer 54 prevents the voids 100, 102, 104, 106 from being infiltrated by unwanted matter deposited by external elements or from subsequent processing steps as well as providing a planar base on which to fabricate subsequent interconnect levels (not shown).

The capacitance between the conductive features defined by conductive wires 34, 35 is proportional to the composite dielectric constant of the materials separating the conductive elements. In this instance, the reduced dielectric constant of the voids 100, 102, 104, 106 in comparison with the dielectric material of dielectric layer 68 reduces the average permittivity to significantly decrease parasitic capacitance between the laterally-adjacent conductive features. The height, $d_1$, of the voids 100, 102, 104, 106 is determined by the layer thickness, $t_1$, of the dielectric layer 68 and the height, $h_1$, of the temporary structures 62, 64, which are approximately equal following planarization. The voids 100, 102, 104, 106 extend vertically to the top surface 66 of dielectric layer 58.

Figure 10A:
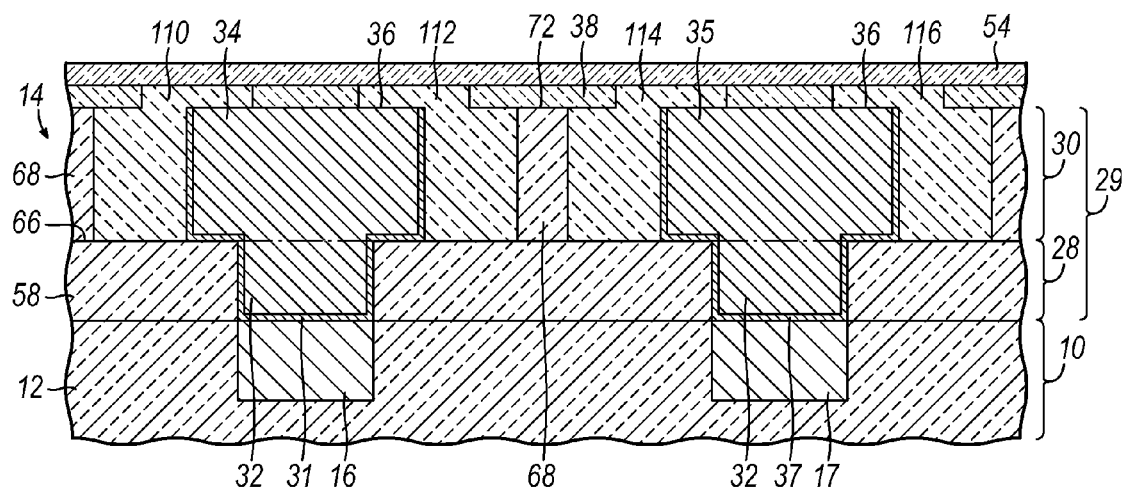
FIG. 10A is a diagrammatic cross-sectional view similar to FIG. 10 in accordance with an alternative embodiment of the invention.

With reference to FIG. 10A in which like reference numerals refer to like features in FIG. 9 and at a subsequent fabrication stage to FIG. 9 in accordance with an alternative embodiment of the invention, the voids 100, 102, 104, 106 formed by the selective etching of temporary structure 62 may be filled with respective plugs 110, 112, 114, 116 of a material having a lower dielectric constant than the dielectric material constituting the dielectric layer 12 and the dielectric material forming the hardmask 38. The plugs 110, 112, 114, 116 are similar in construction to plugs 56, 57 (FIG. 5A). In this embodiment, dielectric layer 54 is formed on the top surface of the plugs 110, 112, 114, 116 and hardmask layer 38 by the same deposition and planarization techniques as described in connection with FIG. 5. The material contained in the plugs 110, 112, 114, 116 may be utilized to provide improved structural integrity to dielectric layer 60 or to prevent infiltration of voids 110, 112, 114, 116 by the dielectric material of relatively higher dielectric constant forming dielectric layer 54. In one specific embodiment, the dimensions of the windows 90, 92, 94, 96 created in hardmask 38 may be used to allow some voids 100, 102, 104, 106 to be filled with a respective one of the plugs 110, 112, 114, 116 while limiting the infiltration of other voids 100, 102, 104, 106 so that they remain primarily unfilled by dielectric material.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for fabricating a back-end-of-line (BEOL) interconnect structure, the method comprising:
   forming a first temporary feature on a top surface of a first dielectric layer;
   depositing a second dielectric layer comprised of a first dielectric material on the top surface of the first dielectric layer;
   planarizing the second dielectric layer and the first temporary feature such that a layer thickness of the second dielectric layer is approximately equal to a height of the first temporary feature;
   forming a first conductive feature that extends from a top surface of the second dielectric layer to a conductive element in the first dielectric layer and that is located in the second dielectric layer laterally adjacent to the first temporary feature;

removing the first temporary feature from the second dielectric layer to define a first void in the second dielectric layer laterally adjacent to the first conductive feature; and filling the first void formed in the second dielectric layer with a second dielectric material that has a lower dielectric constant than the first dielectric material of the second dielectric layer.

2. The method of claim 1 wherein removing the first temporary feature from the second dielectric layer to define a first void in the second dielectric layer further comprises:

depositing a hardmask layer on a top surface of the second dielectric layer;

patterning the hardmask layer to define a window spatially registered with the first temporary feature; and selectively etching the first temporary feature relative to the second dielectric layer so that the first void is formed in the second dielectric layer.

3. The method of claim 2 further comprising:

depositing a third dielectric layer on a top surface of the hardmask layer to occlude the window.

4. The method of claim 1 wherein removing the first temporary feature from the second dielectric layer to define the first void in the second dielectric layer comprises:

selectively etching a sacrificial material comprising the first temporary feature relative to the first and second dielectric layers.

5. The method of claim 1 wherein further comprising:

forming a second conductive feature that extends from the top surface of the second dielectric layer to the top surface of the first dielectric layer and that is located in the second dielectric layer such that the first temporary feature is laterally located between the first and second conductive features.

6. The method of claim 1 wherein the first temporary feature is comprised of a sacrificial material that etches selectively to a third dielectric material forming the first dielectric layer, and forming the first temporary feature on the top surface of the first dielectric layer comprises:

depositing a layer of the sacrificial material on the top surface of the first dielectric layer;

forming a patterned etch mask on a top surface of the layer of the sacrificial material; and etching portions of the layer of the sacrificial material exposed by the patterned etch mask to define the first temporary feature.

7. The method of claim 1 further comprising:

before the second dielectric layer is deposited, forming a second temporary feature on the top surface of the first dielectric layer that is laterally separated from the first temporary feature by the first conductive feature and that has approximately equal height to the first temporary feature; and when the first temporary feature is removed, removing the second temporary feature from the second dielectric layer to define a second void in the second dielectric layer.

8. The method of claim 7 further comprising:

when the first void is filled, filling the second void formed in the second dielectric layer with the second dielectric material that has the lower dielectric constant than the first dielectric material of the second dielectric layer.

9. The method of claim 7 wherein removing the second temporary feature from the second dielectric layer to define the second void in the second dielectric layer further comprises:

depositing a hardmask layer on a top surface of the second dielectric layer;

patterning the hardmask layer to define a window spatially registered with the second temporary feature; and selectively etching the second temporary feature relative to the second dielectric layer so that the second void is formed in the second dielectric layer.

10. The method of claim 9 further comprising:

depositing a third dielectric layer on a top surface of the hardmask layer to occlude the window; and when the hardmask layer is patterned, selecting dimensions of the window such that a portion of the third dielectric layer will occlude the window in the hardmask and close the first void so that a majority of the first void is unfilled by a fourth dielectric material from the third dielectric layer.

11. The method of claim 1 wherein the first temporary feature is formed on the top surface of the first dielectric layer before the second dielectric layer is deposited.

12. The method of claim 1 further comprising:

before the second dielectric layer is deposited, forming a second temporary feature on the top surface of the first dielectric layer that is laterally separated from the first temporary feature by the first conductive feature and that has approximately equal height to the first temporary feature.

13. The method of claim 12 wherein depositing the second dielectric layer comprised of the first dielectric material on the top surface of the first dielectric layer comprises:

filling a space laterally between the first temporary feature and the second temporary feature with a portion of the second dielectric material of the second dielectric layer.

14. The method of claim 1 wherein the first temporary feature is comprised of polycrystalline silicon.

15. The method of claim 1 wherein the second dielectric material is a porous oxide, an organic polymer, non-porous hydrogen-enriched silicon oxycarbide (SiCOH), or carbon doped oxide (CDO).

16. The method of claim 1 wherein removing the first temporary feature from the second dielectric layer to define a first void in the second dielectric layer further comprises:

forming a resist layer on a top surface of the second dielectric layer;

patterning the resist layer to define a window spatially registered with the first temporary feature; and selectively etching the first temporary feature relative to the second dielectric layer so that the first void is formed in the second dielectric layer.

17. The method of claim 16 further comprising:

removing the resist layer; and after the first void is filled with the second dielectric material, depositing a third dielectric layer on a top surface of the second dielectric layer to occlude the window.

* * * * *